(12) United States Patent
Ashida

(10) Patent No.: US 7,268,303 B2
(45) Date of Patent: Sep. 11, 2007

(54) CIRCUIT BOARD, MOUNTING STRUCTURE OF BALL GRID ARRAY, ELECTRO-OPTIC DEVICE AND ELECTRONIC DEVICE

(75) Inventor: Takeshi Ashida, Matsumoto (JP)

(73) Assignee: Seiko Epson Corporation (JP)

( * ) Notice: Subject to any disclaimer, the term of this patent is extended or adjusted under 35 U.S.C. 154(b) by 369 days.

(21) Appl. No.: 10/682,780

(22) Filed: Oct. 9, 2003

(65) Prior Publication Data

US 2004/0108135 A1    Jun. 10, 2004

(30) Foreign Application Priority Data

Oct. 11, 2002   (JP)   ............... 2002-298980

(51) Int. Cl.
*H05K 1/16* (2006.01)

(52) U.S. Cl. ............ 174/260; 174/250; 174/255; 174/263; 174/256; 174/261; 361/760; 361/767; 361/779; 257/737; 257/738; 257/778; 257/786; 257/780

(58) Field of Classification Search ......... 174/260, 174/250, 255, 263, 256, 261; 361/780, 767, 361/760, 743, 779; 257/737, 738, 778, 786, 257/780

See application file for complete search history.

(56) References Cited

U.S. PATENT DOCUMENTS

| | | | | |
|---|---|---|---|---|
| 5,834,848 A | * | 11/1998 | Iwasaki | 257/778 |
| 6,050,481 A | * | 4/2000 | Chapman et al. | 228/254 |
| 6,059,172 A | * | 5/2000 | Chapman et al. | 228/180.22 |
| 6,165,885 A | * | 12/2000 | Gaynes et al. | 438/612 |
| 6,204,559 B1 | * | 3/2001 | Lin et al. | 257/738 |
| 6,239,383 B1 | * | 5/2001 | Lin | 174/260 |
| 6,291,899 B1 | * | 9/2001 | Wensel et al. | 257/787 |
| 6,387,731 B1 | * | 5/2002 | Wensel et al. | 438/121 |
| 6,388,335 B1 | | 5/2002 | Lam | |
| 6,431,432 B1 | | 8/2002 | McCormick et al. | |
| 6,570,259 B2 | * | 5/2003 | Alcoe et al. | 257/778 |
| 6,622,380 B1 | * | 9/2003 | Grigg | 29/840 |
| 6,667,557 B2 | * | 12/2003 | Alcoe et al. | 257/778 |
| 6,812,410 B2 | | 11/2004 | Sakamoto et al. | |
| 6,906,425 B2 | * | 6/2005 | Stewart et al. | 257/778 |

(Continued)

FOREIGN PATENT DOCUMENTS

JP    04-318993    11/1992

(Continued)

OTHER PUBLICATIONS

Communication from Korean Patent Office regarding related application.

(Continued)

*Primary Examiner*—Tuan T. Dinh
*Assistant Examiner*—Hoa C Nguyen
(74) *Attorney, Agent, or Firm*—Harness, Dickey & Pierce, P.L.C.

(57) ABSTRACT

In a circuit board including a pad for mounting a ball grid array and a wiring, a mounting structure of the ball grid array, an electro-optic device, and an electronic device, the circuit board includes a pad for mounting the ball grid array, a wiring for connecting the pad and an external terminal, and a soldering resist having an opening portion exposing the pad and the wiring.

6 Claims, 21 Drawing Sheets

U.S. PATENT DOCUMENTS

2001/0005050 A1    6/2001    Ohsawa et al.

FOREIGN PATENT DOCUMENTS

| JP | 10-290058 | 10/1998 |
| JP | 2000-031630 | 1/2000 |
| JP | 2000-298352 | 10/2000 |
| JP | 2002-134555 | 5/2002 |
| KR | 1999-0045687 | 6/1999 |
| KR | 2002-0059851 | 7/2002 |

OTHER PUBLICATIONS

Communication from Japanese Patent Office regarding corresponding application.

* cited by examiner $t1 \geq 0.1mm$ $t2 \geq 0.6mm$
$t3 < 0.6mm$ 411
413k 411
413l (b)

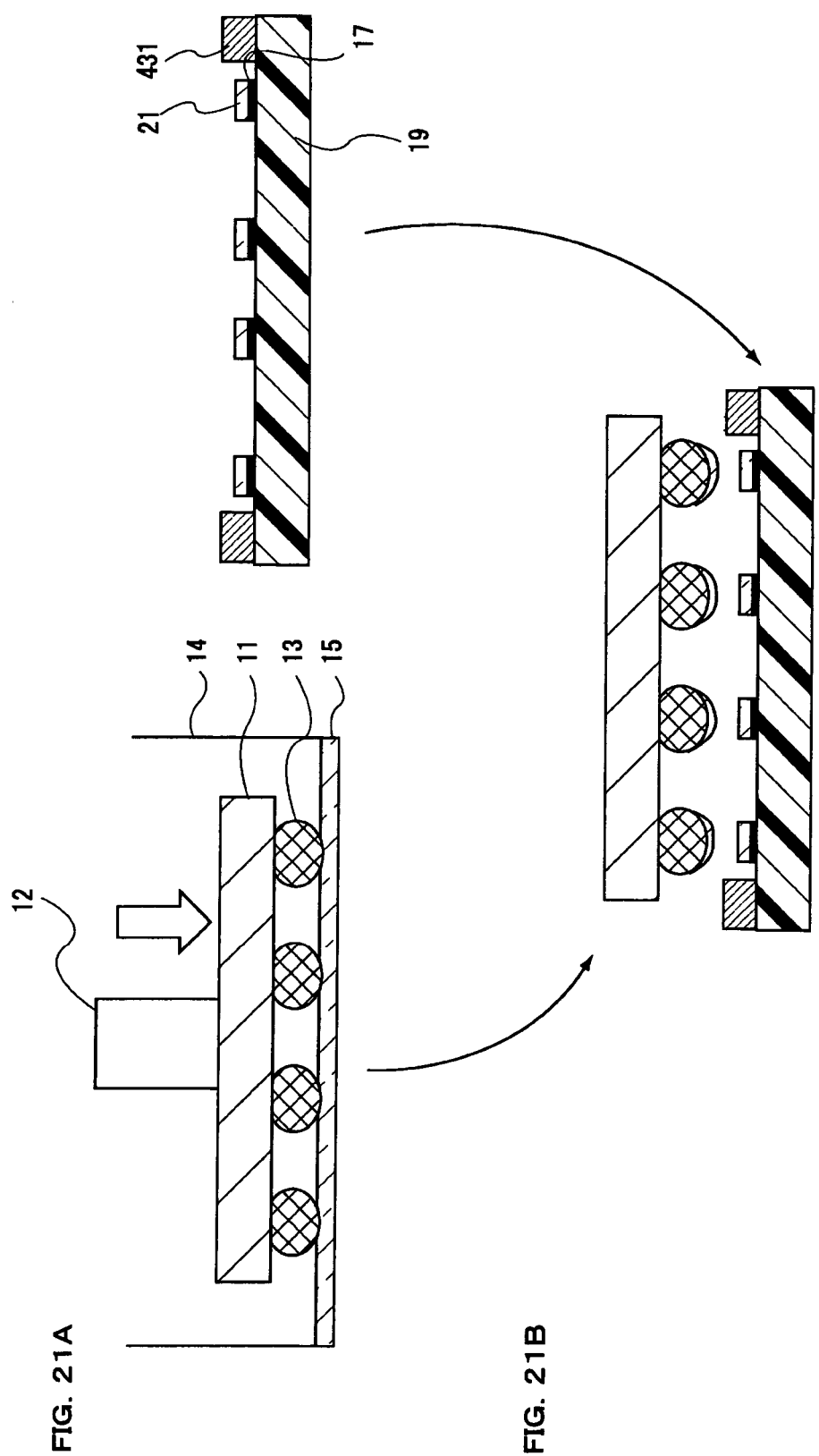

382
384
386
388

CIRCUIT BOARD, MOUNTING STRUCTURE OF BALL GRID ARRAY, ELECTRO-OPTIC DEVICE AND ELECTRONIC DEVICE

BACKGROUND OF THE INVENTION

1. Technical Field

The present invention relates to a circuit board, a mounting structure of a ball grid array, an electro-optic device, and an electronic device. More particularly, the present invention relates to a circuit board, a mounting structure of a ball grid array, an electro-optic device, and an electronic device, in which the printing margin of a soldering material is increased upon mounting the ball grid array on the circuit board by reflow processing.

2. Related Art

According to a widespread conventional method, a QFP (Quad Flat Package) is mounted on a printed circuit board (PCB) as a mounting method corresponding to the fine pitch or the multi-pin structure of a lead terminal of a semiconductor device. According to the method, the QFP as a flat package having a large number of gull-wing lead terminals at four sides of the package is generally mounted on the PCB containing resin. Further, the QFP is used while it is electrically connected to a conductive portion of the PCB.

However, in accordance with the further fine pitch or multi-pin structure, the QFP has a problem that the reliability of the connection is deteriorated due to a short circuit caused by a soldering bridge upon mounting or the shortage of soldering. In addition, the QFP has another problem that the mounting area on the PCB is increased corresponding to an externally projected portion of the lead terminal from the package.

Then, in order to respond to the further fine pitch or multi-pin structure of the semiconductor device, a mounting method using a ball grid array (hereinafter, referred to as a BGA) or a chip size package (hereinafter, referred to as CSP) and a printed circuit board for mounting it are proposed.

Referring to FIG. 25, a single printed-circuit board has semiconductor package lands 382 and 384 having different shapes and, on the printed-circuit board, lands to which terminals having the same function are connected by a pattern wiring 388. If changing the shape of the package mounted on the printed circuit board, the same printed-circuit board is used without manufacturing another printed-circuit board.

Further, according to another mounting method, an electric part in which the exchange and the maintenance of the BGA, etc. are not possible is soldered so as to prevent the soldering defect. As schematically shown in a flowchart of FIG. 26, specifically, a mounting method 290 includes: a step 291 of printing cream soldering on a predetermined position on the PCB; a step 292 of mounting, by a mounter, a semiconductor device with a bump such as the BGA (including a chip size package (CSP) with a pitch of not more than 0.8 mm) at a predetermined position on the PCB to which the cream soldering is printed; a step 293 of performing an X-ray inspection and of selecting whether or not the semiconductor device is defective; and a step 294 of heating only the nondefective semiconductor device passing the X-ray inspection by reflow processing and mounting.

Further, referring to FIGS. 27(a) to (d), according to another mounting method of the BGA, a cream soldering 312 is coated to a cave (recessed) portion 311 arranged on a board 310.

Specifically, referring to FIG. 27(a), the board 310 having a plurality of cave portions 311 on its surface is provided. Referring to FIG. 27(b), the cream soldering 312 is coated to the plurality of cave portions 311. Furthermore, referring to FIG. 27(c), a bump 317 of a BGA 315 is positioned to the plurality of cave portions 311. In addition, referring to FIG. 27(d), the bump 317 is mounted by reflow processing and is pressed and bonded.

According to another method, referring to FIGS. 28(a) to (c), a semiconductor device 345 with a bump is thermally bonded to a pad 341 of a board 343 via an Anisotropic Conductive Film (hereinafter, referred to as an ACF) 349.

According to the mounting method using the ACF 349, in the CSP in which the pitch of the bump 347 is narrow, for example, it is 0.1 mm to 0.5 mm, the short circuit between the adjacent bumps is efficiently prevented. Advantageously, a large number of bumps 347 are electrically connected.

However, on the convention printed-circuit board, upon mounting the semiconductor device with a fine bump, e.g., the BGA, a soldering material as a conductive material must be precisely printed onto a fine land (pad). Thus, the conventional printed-circuit board has a problem that the position for printing and the printing operation take a long time and the position of the printed soldering material is easily deviated from the pad. In particular, since the CSP has a further fine pitch as compared with the BGA, it is difficult to print the soldering material precisely and mount it on the land (pad) of the printed circuit board on which the FPC is easily modified.

According to the mounting method as shown in FIG. 26, the X-ray inspection must be performed before the heating using reflow processing. Therefore, the mounting method has a problem that the number of steps is increased, the manufacturing management is complicated, and the manufacturing time is long. Since the cream soldering must precisely be printed on the fine pad, the positioning for printing and the printing operation take a long time.

According to the mounting method as shown in FIG. 27, it is difficult to form the pad having the cave portion. Further, since the soldering must be precisely printed to the pad having the fine cave portion, the mounting method has a problem that the positioning for printing and the printing operation take a long time.

Further, the mounting method using the ACF has problems that not only the costs of the ACF are increased but also mounting simultaneously to another device is not performed. That is, the ACF which is thermally bonded and mounted, and the other device mounted by the soldering reflow processing must be mounted independently in consideration of the different mounting processes.

As a result of considering the above problems, it has been discovered that by providing a soldering resist having an opening portion which is open so that the entire or a part of the pad and wiring connected to the BGA is exposed, the coating margin (printing margin) of the soldering material is increased, the printing deviation due to the setting of an uneven portion of the resist is not caused, and thus the soldering material is coated precisely and easily. Further, the defect for connection is caused due to the deviation of printing of the soldering material. In this case, it is found that the soldering material out of the pad due to the printing deviation returns to the pad upon reflowing by its fluid property, irrespective of the deviation or uneven portion of the resist.

As such, it is an object of the present invention to provide a circuit board in which the mounting position of a BGA (including the CSP) is not deviated due to the coating defect of the soldering material when the BGA is mounted by reflow processing via the soldering material, a mounting structure of the BGA using the circuit board, an electro-optic device, and an electronic device.

SUMMARY

In order to solve the above-mentioned problems, according to the present invention, there is provided a circuit board comprising: a pad for mounting a BGA; a wiring for connecting the pad and an external terminal; and a soldering resist, wherein the soldering resist has an opening portion exposing the pad and the wiring.

The above-mentioned structure facilitates the coating of the soldering material and increases the coating margin of the soldering material.

Preferably, when the area of the mounted BGA is 100%, the area of the opening portion has a value within a range of 50% to 150%.

The above-mentioned structure facilitates the coating of the soldering material and increases the coating margin of the soldering material.

Further, preferably, the soldering resist or its end portion exists at the position of 0.1 mm toward the inner region from the outer circumference in the portion for mounting the BGA in the structure of the circuit board according to the present invention.

With the above structure, since an end portion of the BGA has the soldering resist, a short-circuited edge is effectively prevented.

In the circuit board according to the present invention, preferably, when the pitch of the bump of the mounted BGA has a narrow portion less than 0.6 mm and a wide portion not less than 0.6 mm, the opening portion of the soldering resist is arranged in accordance with the pad corresponding to the narrow portion of the BGA.

With the above-mentioned structure, the design of the circuit board is easily performed, irrespective of the pitch of the bump.

Preferably, in the circuit board according to the present invention, the thickness of the soldering resist is 1% to 50% of the height of the bump of the mounted BGA.

With the above-mentioned structure, the advantages for the soldering resist and the advantage for preventing the short-circuited edge are obtained. The soldering resist is easily formed.

In the circuit board according to the present invention, a pad for mounting an electronic element other than the BGA is provided. Preferably, the soldering resist exists near the pad.

With the above-mentioned structure, the electronic element other than the BGA can easily be mounted together with the BGA.

Further, in order to solve the above-mentioned problems, according to another embodiment of the present invention, there is provided a mounting structure of a BGA for mounting the BGA on a circuit board, wherein the circuit board includes: a pad for mounting the BGA; a wiring; and a soldering resist. The soldering resist has an opening portion for exposing the pad and the wiring.

That is, with the above-mentioned structure, the margin is wide when the soldering material is coated. Even upon mounting the BGA or the CSP on the circuit board, the deviation of the mounting position is suppressed.

With the mounting structure of the BGA according to the present invention, preferably, an under-fill is filled between the BGA and the circuit board with the following properties:

(1) volume resistance having a value within a range of $1 \times 10^6$ to $1 \times 10^{20}$ $\Omega \cdot$cm,
(2) tensile strength having a value within a range of 1 to 200 MPa, and
(3) Break stretch having a value within a range of 10% to 500%.

The above-mentioned structure provides the mounting structure of the BGA in which environmental stability and mechanical strength are improved.

In order to solve the above-mentioned problems, according to another embodiment of the present invention, there is provided an electro-optic device comprising a BGA, as a driving element or a power supply element, mounted on a circuit board comprising: a pad for mounting the BGA; a wiring for connecting the pad and an external terminal; and a soldering resist having an opening portion for exposing the pad and the wiring.

That is, the above-mentioned structure effectively provides the electro-optic device using the circuit board in which the deviation of mounting position of the BGA is suppressed.

In order to solve the above-mentioned problems, according to another embodiment of the present invention, there is provided an electronic device comprising the electro-optic device and control means for controlling the electro-optic device.

That is, the above-mentioned structure effectively provides the electronic device including the electro-optic device using the circuit board in which the deviation of mounting position of the BGA is suppressed.

BRIEF DESCRIPTION OF THE DRAWINGS

FIGS. 21(a) and (b) are a diagram showing processes for explaining another method for mounting the semiconductor device with the bump on the circuit board (No. 3).

FIG. 28A-D is a diagram for explaining a mounting method of a semiconductor device with a bump using an Anisotropic Conductive Film (ACF).

DETAILED DESCRIPTION

Hereinbelow, a description is given of a circuit board, a mounting structure of a BGA, an electro-optic device using it, and an electronic device according to embodiments of the present invention with reference to the drawings.

The embodiments of the present invention indicate examples and do not limit the present invention and, they can arbitrarily be changed within a range of the present invention.

FIRST EMBODIMENT

Figure 1:
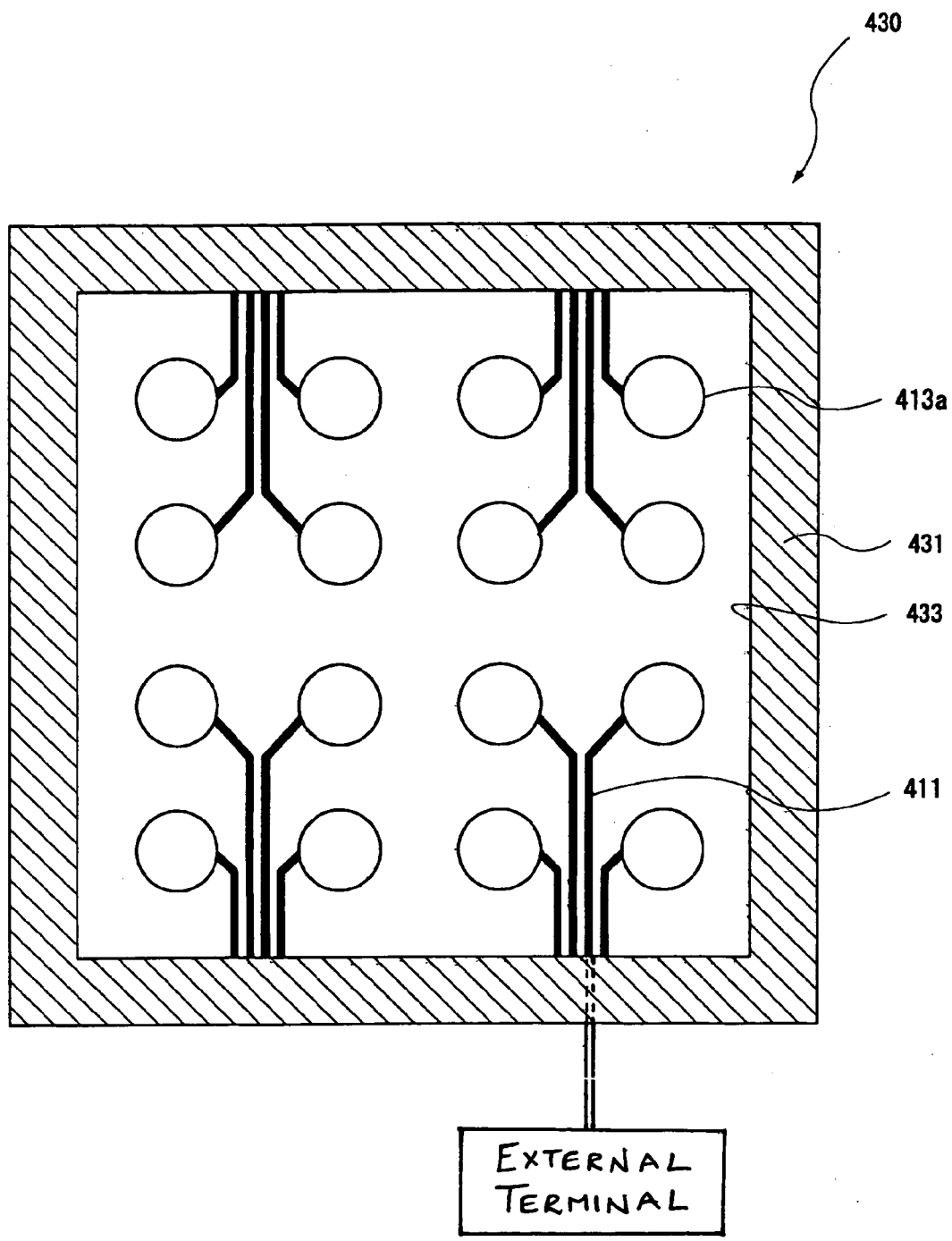
FIG. 1 is a diagram for explaining a circuit board according to a first embodiment.

According to a first embodiment, referring to FIG. 1, a circuit board comprises: a pad 413a for mounting a BGA; a wiring 411 for connecting the pad 413a and an external terminal; a soldering resist 431. In the circuit board, the soldering resist 431 has an opening portion 433 for exposing the pad 413a and the wiring 411.

1. Circuit Board (1) Soldering Resist

1) Area of Opening Portion

If the area of the mounted BGA is 100%, preferably, the area of the opening portion in the soldering resist has a value within a range of 50% to 150%.

Because when the area of opening portion in the soldering resist has a value of 50% or less, the design for the pad or the wiring is excessively limited. Further, when the area of the opening portion in the soldering resist is over 150%, the occurrence of a short-circuited edge may not be effectively prevented. When the area of the opening portion is over 100%, the short-circuited edge may be caused; however, this is effectively prevented by adjusting the height of the bump or by filling with an under-fill.

Therefore, when the area of the mounted BGA is 100%, the area of the opening portion in the soldering resist is more preferably within a range of 60% to 99%. Even more preferably, it is within a range of 70% to 90%.

2) Position 1

Figure 2:
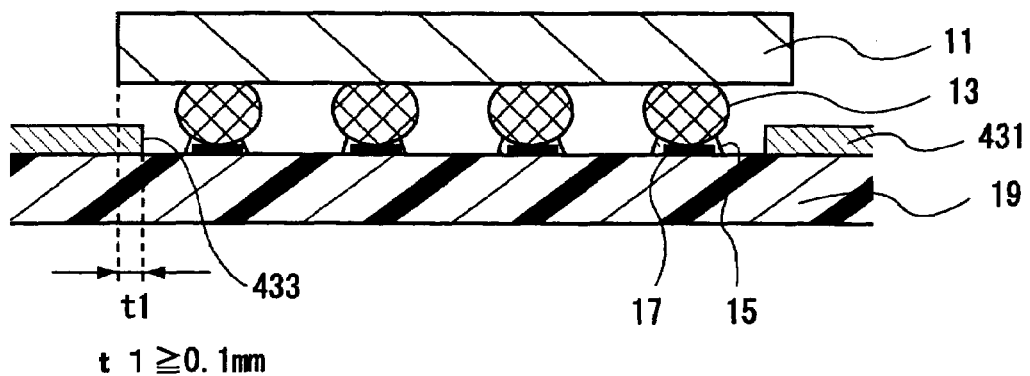
FIG. 2 is one cross-sectional view for explaining the position of a soldering resist on the circuit board (No. 1).

Referring to FIG. 2, preferably, the soldering resist 431 or its end portion exists at the position of at least 0.1 mm toward the inner region from the outer circumference in the portion for mounting the BGA 11.

Because, when the soldering resist or its end portion does not exist at the position of at least 0.1 mm toward the inner region from the outer circumference in the portion for mounting the BGA, it is difficult to effectively prevent the occurrence of the short-circuited edge upon mounting the BGA.

However, when an excessive amount of soldering resist exists toward the inner region from the outer circumference, the design of the pad or the wiring may be largely limited.

Therefore, more preferably, the soldering resist or its end portion exists within a range of 0.11 mm to 1 mm toward the inner region from the outer circumference in the position for mounting the BGA. Even more preferably, the soldering resist or its end portion exists within a range of 0.15 mm to 0.5 mm toward inner region from the outer circumference.

3) Position 2

Figure 3:
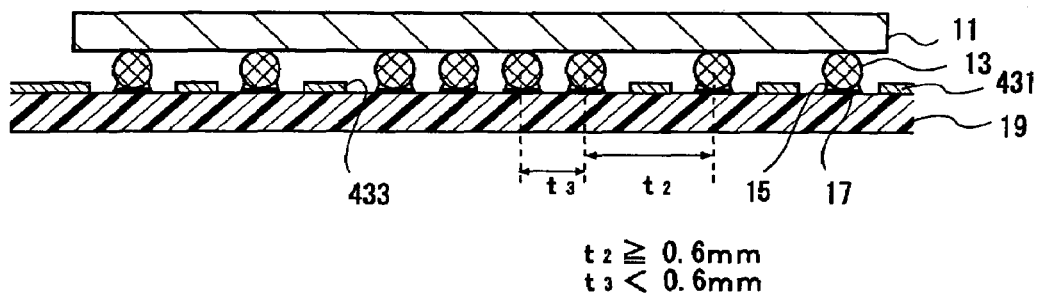
FIG. 3 is another cross-sectional view for explaining the position of the soldering resist on the circuit board (No. 2).

Preferably, referring to FIG. 3, when the pitch of a bump 13 of the mounted BGA 11 includes both a narrow portion less than 0.6 mm and a wide portion not less than 0.6 mm, only a pad 17 corresponding to the narrow pitch of the bump 13 of the BGA 11 has an opening portion 433 in the soldering resist 431.

Because the arrangement of the opening portion at the narrow pad corresponding to the BGA responds to the varied pitch of the bump with the above structure, the circuit board is easily designed. That is, at the pad corresponding to the wide pitch of the BGA, the coating margin of the soldering material can be wide without providing an opening portion.

4) Thickness

Referring to FIG. 2, preferably, the thickness of the soldering resist 431 is within a range of 1% to 50% of the height of the bump 13 of the mounted BGA 11.

Because the thickness of soldering resist is limited, the advantage of the soldering resist and the advantage for preventing the short-circuited edge is obtained. Further, the soldering resist is easily formed.

More preferably, the thickness of the soldering resist is 1% to 40% of the height of the bump of the mounted BGA. Even more preferably, it is 1% to 30% thereof.

5) Another Opening Portion

Figure 4:
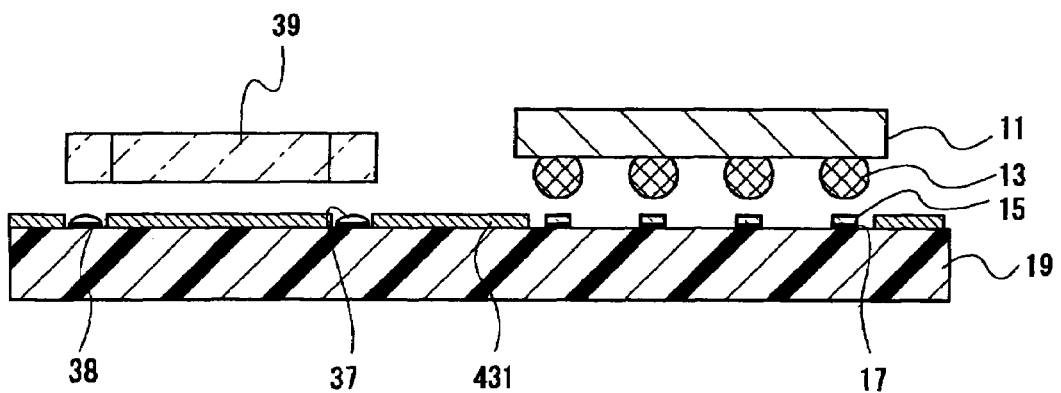
FIG. 4 is a diagram for explaining a method for simultaneously mounting a BGA and another electronic element on the circuit board.

Referring to FIG. 4, preferably, a pad 38 for mounting an electronic element 39 other than the BGA is provided and the soldering resist 431 adjacently exists around the pad 38.

With the above-mentioned structure, the electronic element other than the BGA is easily and simultaneously mounted on the circuit board together with the BGA.

(2) Circuit Board

1) Type

The type of circuit board includes ones made of rigid glass epoxy PCB and ceramic PCB and, however, it is not limited to those. Preferably, referring FIG. 5, the FPC is formed by mounting a metallic wiring on materials made of polyimide resin or polyester resin, and it is used for a cellular phone, etc. because it is light and thin and can be bent.

Figure 5:
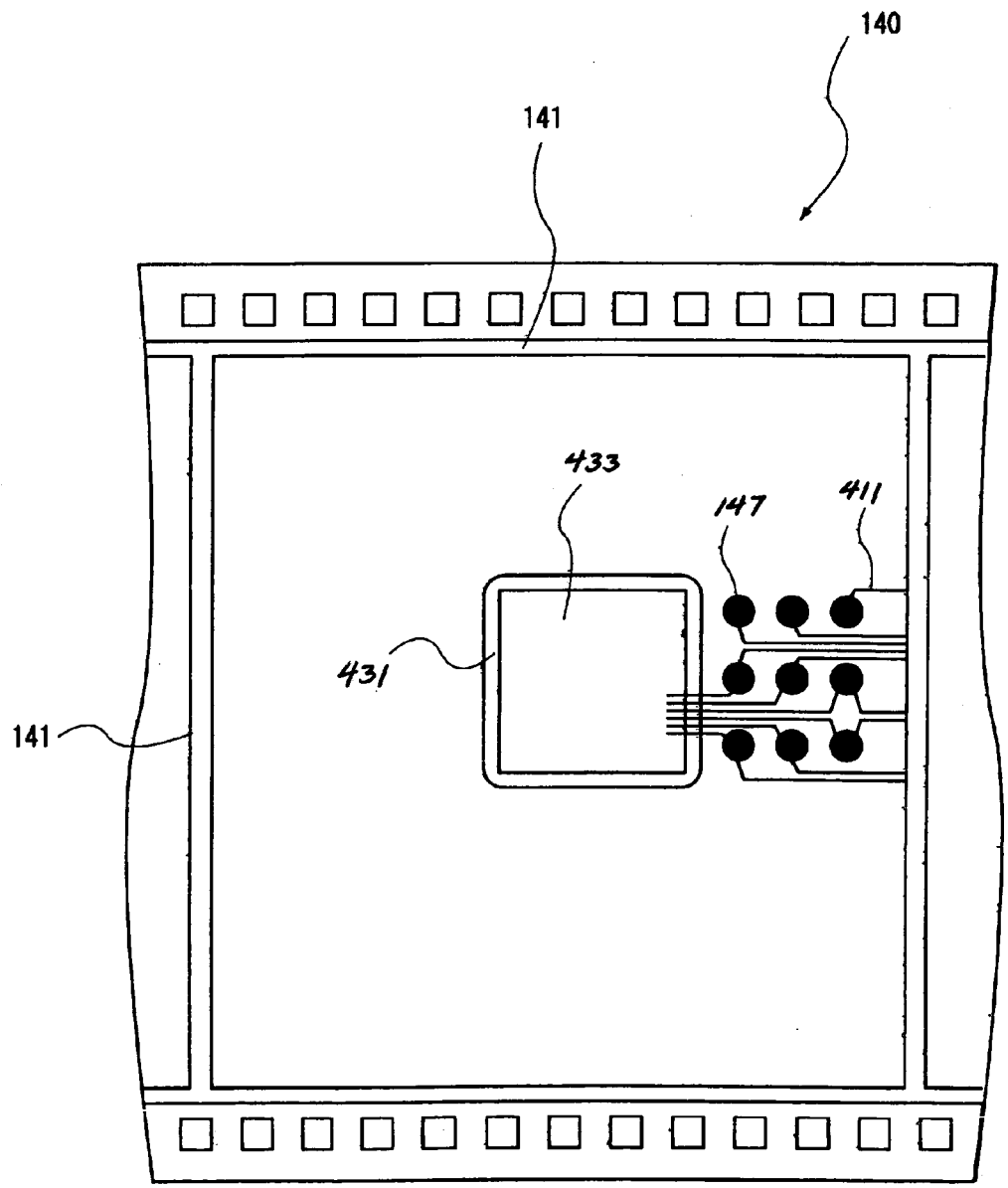
FIG. 5 is a diagram for explaining an FPC.

That is, referring to FIG. 5, a flexible substrate 141 comprises a plurality of pads 147. Further, by using an FPC 140 having sprockets at both ends thereof, a semiconductor device with the bump is continuously mounted.

2) Pitch 1 of Pad

Figure 6:
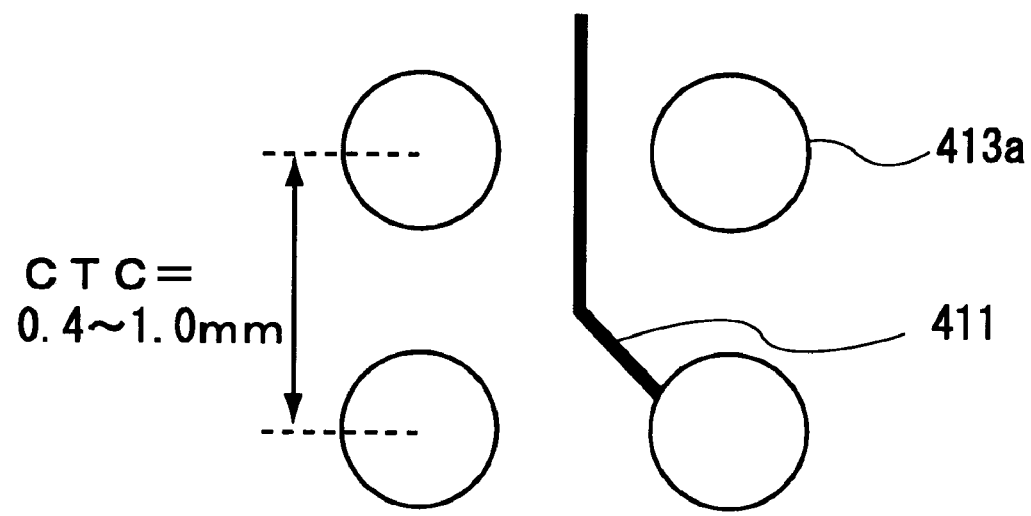
FIG. 6 is one diagram for explaining the distance between adjacent pads (No. 1).

Referring to FIG. 6, when the pitch of a pad 413a is defined by the distance from the center position between the pads to the center position between the adjacent pads, namely, CTC (Center to Center), preferably, the pitch of the pad is within a range of 0.4 mm to 1.0 mm.

Because, when the pitch of the pad is less than 0.4 mm, the wiring cannot be pulled out and the width of wiring needs to be excessively narrow. Further, the soldering bridge is frequently caused.

When the pitch of the pad is more than 1 mm, the number of pads is excessively limited and it might be difficult to mount the CSP or BGA having the multi-pin structure.

Therefore, more preferably, the pitch of the pad is within a range of 0.45 mm to 0.8 mm. Even more preferably, it is within a range of 0.5 mm to 0.6 mm.

3) Pitch 2 of Pad

Figure 7A:
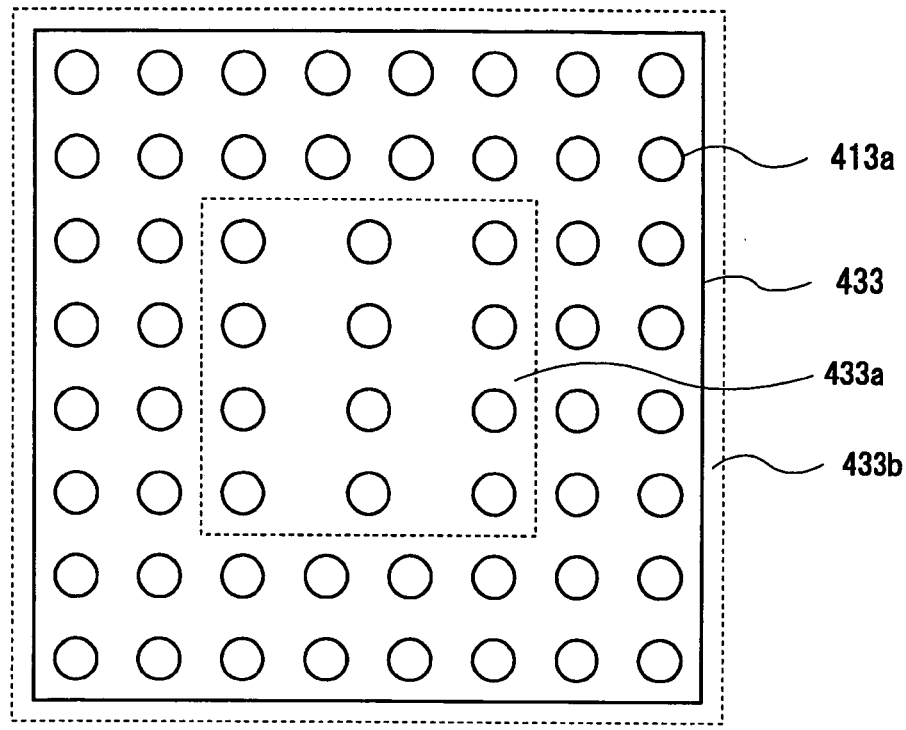
FIG. 7 is another diagram for explaining the distance between the adjacent pads (No. 2).

Preferably, referring to FIG. 7(a), near the center of a bottom 433 of the BGA, a region 433a is arranged with the pitch of the pad in the longitudinal direction and the pitch of the pad in the lateral direction different therefrom.

Because, when the wiring is concentratedly pulled out near the center of the bottom of the BGA, the arrangement of the region having the different pitches enables the wiring in any of the longitudinal direction and the lateral direction in which the wide pitch is provided to preferentially be pulled out.

Figure 7B:
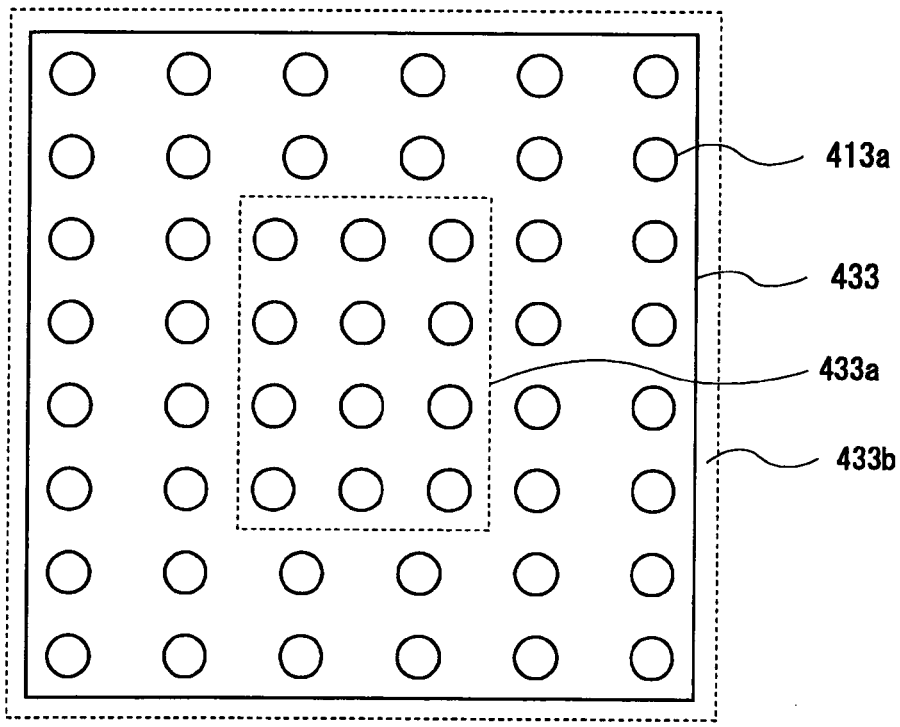

Preferably, referring to FIG. 7(b), a region 433b is provided in a peripheral area of the bottom 433 of the BGA with the pitch of the pad in the longitudinal direction and that of the pitch of the pad in the lateral direction different therefrom.

Because when the wiring to the outside is concentratedly pulled out near the peripheral area of the bottom of the BGA, the arrangement of the region having the different pitches enables the wiring in any of the longitudinal direction and the lateral direction in which the wide pitch is provided to preferentially be pulled out.

4) Area of Pad

Preferably, the area of the pad has a value within a range of 0.01 mm$^2$ to 0.5 mm$^2$.

Because, when the area of the pad has a value less than 0.01 mm$^2$, it is difficult to coat the soldering material and the electric connection to the BGA may be unstable.

Further, when the area of the pad has a value more than 0.5 mm$^2$, it is difficult to pull out the wiring, the width of wiring may become too narrow, and s soldering bridge may frequently occur.

Hence, more preferably, the area of the pad has a value within a range of 0.03 mm$^2$ to 0.3 mm$^2$. Even more preferably, it has a value within a range of 0.05 mm$^2$ to 0.1 mm$^2$.

5) Plan Shape of Pad

Figure 8:
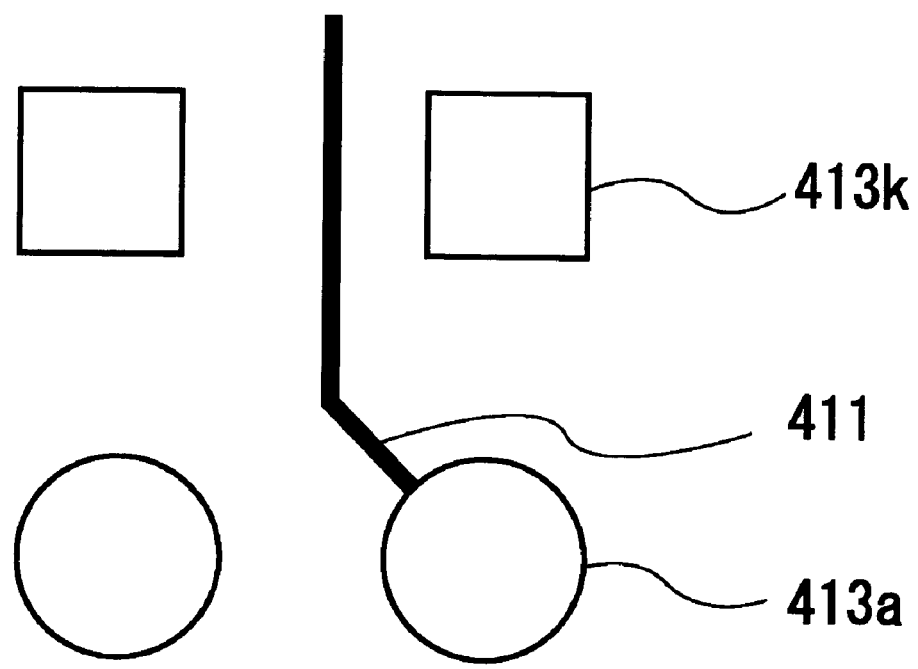
FIG. 8 is a diagram showing the shape of pad.

Referring to FIG. 8, preferably, the plan shape of the pad is circular or square. Because the plan shape causes the formation of the pad with high reproducibility and further causes the efficient use of the entire pad.

Figure 9A:
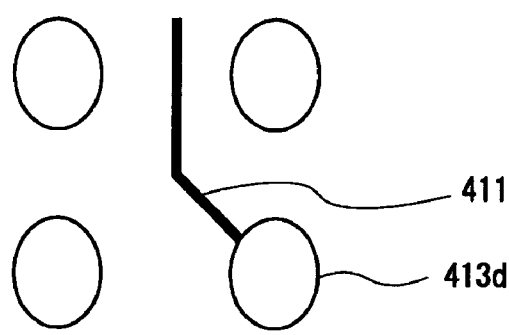
FIGS. 9(a) to (d) are a diagram showing the shapes of modified pads.
Figure 9B:
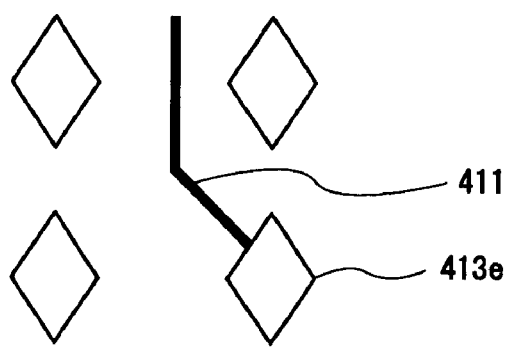
Figure 9C:
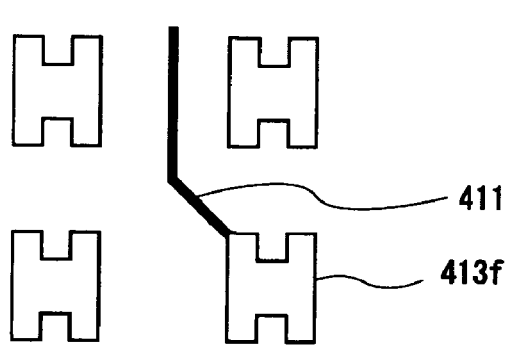
Figure 9D:
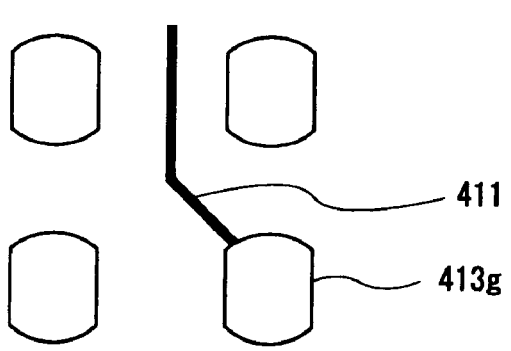
Figure 10A:
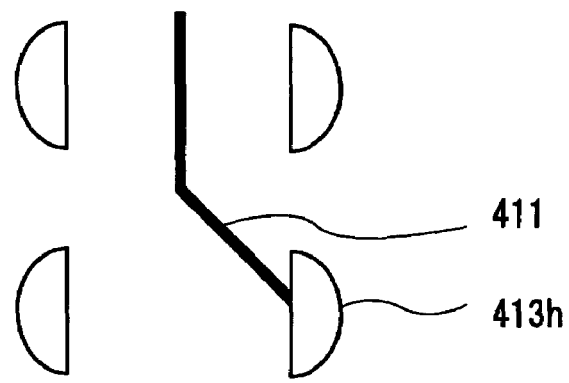
FIGS. 10(a) to (c) are one diagram showing the plan shapes of the modified pads.
Figure 10B:
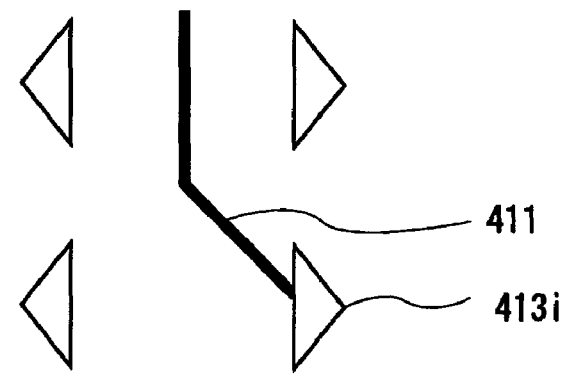
Figure 10C:
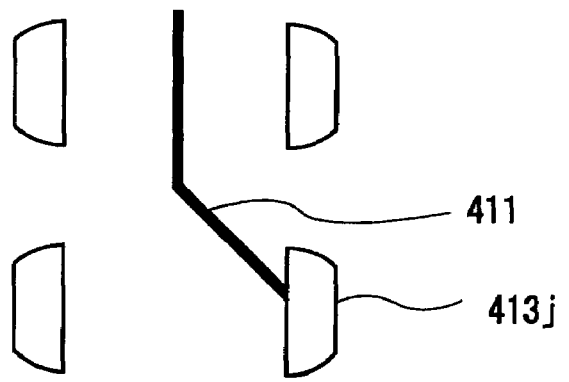
Figure 11A:
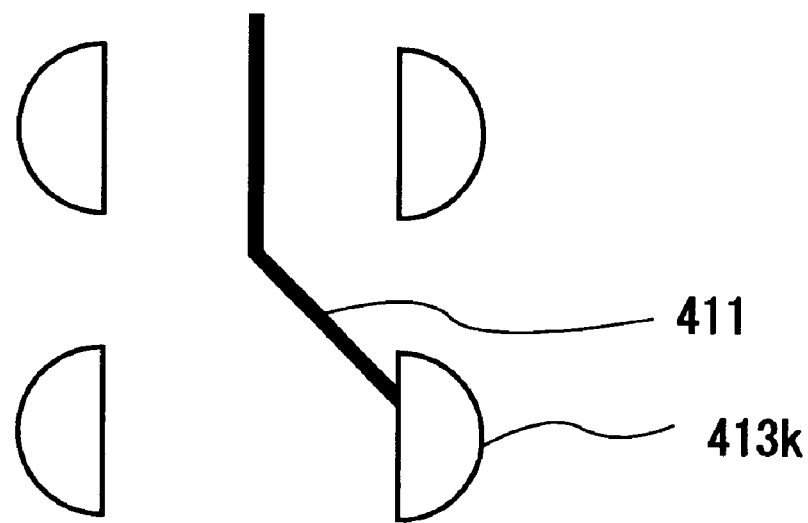
FIGS. 11(a) and (b) are another diagram showing the plan shapes of the modified pads.
Figure 11B:
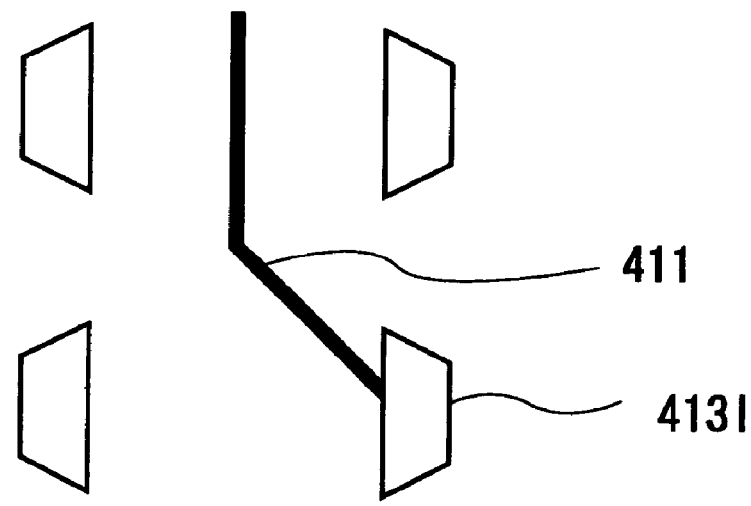

Preferably, the plan shape of the pad is non-circular or non-square. For example, referring to FIG. 9(a), it is elliptic. Referring to FIG. 9(b), it is diamond-shaped. Referring to FIG. 9(c), it is modified-rectangular (H-shape). Referring to FIG. 9(d), it is rectangular-round shaped. Referring to FIG. 10(a), it is semi-elliptic (half-elliptic). Referring to FIG. 10(b), it is semi-diamond-shaped (half-diamond or triangular). Referring to FIG. 10(c), it is semi-rectangular-round shaped (half rectangular-round). Referring to FIG. 11(a), it is semi-circular, (half circular). Referring to FIG. 11(b), it is semi-polygonal (half polygonal). Alternatively, preferably, it is at least one of ⅓-circular, ⅔-circular, ⅕-circular, ⅖-circular, ⅗-circular, and ⅘-circular shapes.

Because the modified pad has the plan shape, thus, the rate for preventing the pull-out of the wiring is reduced, the margin for positional deviation is widely ensured upon coating the soldering material, and the manufacturing efficiency of the circuit board is improved. Further, the pad having the above plan shape is formed with high reproducibility.

2. BGA (1) Type

Figure 12:
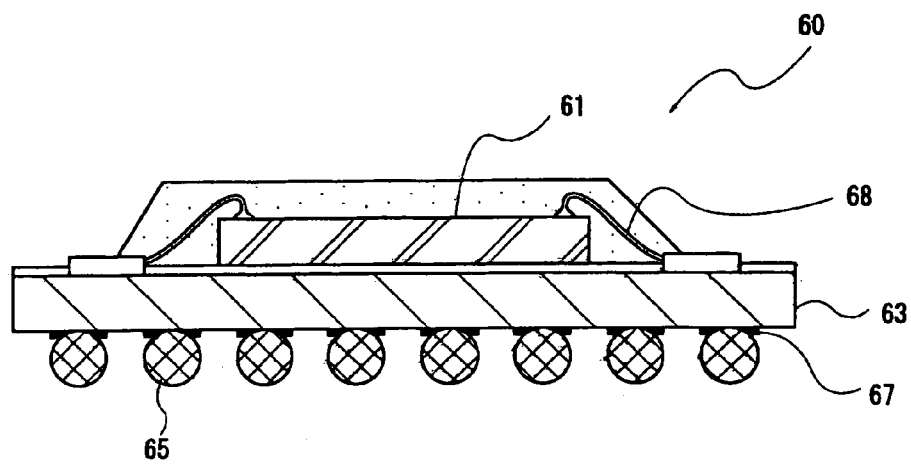
FIG. 12 is a cross-sectional view for explaining one structure of the BGA (No. 1).
Figure 13:
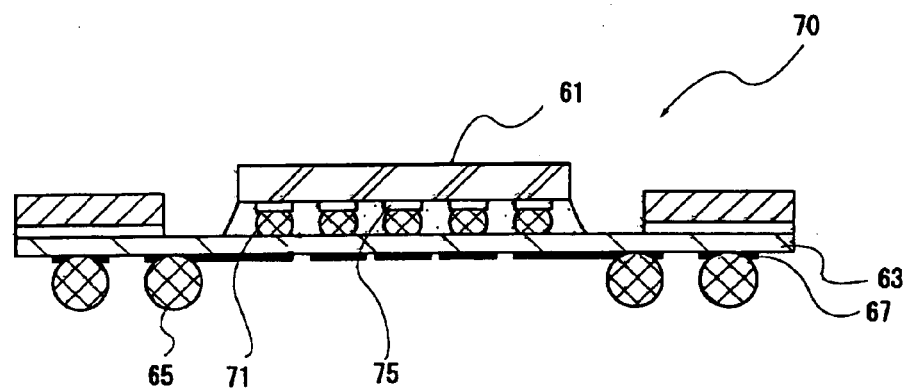
FIG. 13 is a cross-sectional view for explaining another structure of the BGA (No. 2).
Figure 14:
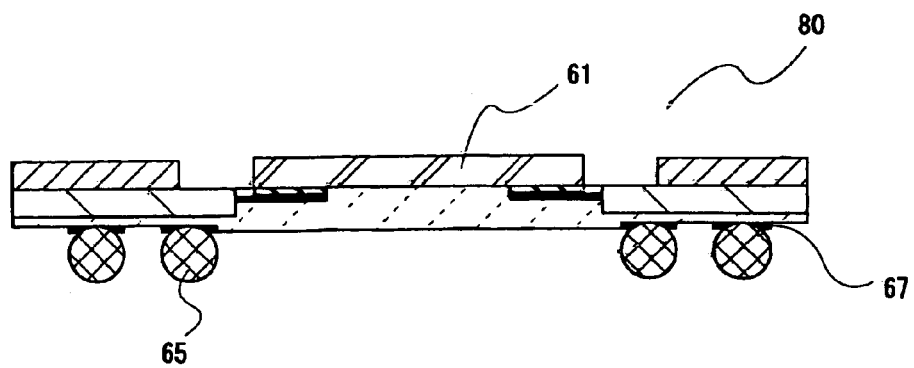
FIG. 14 is a cross-sectional view for explaining another structure of the BGA (No. 3).
Figure 15:
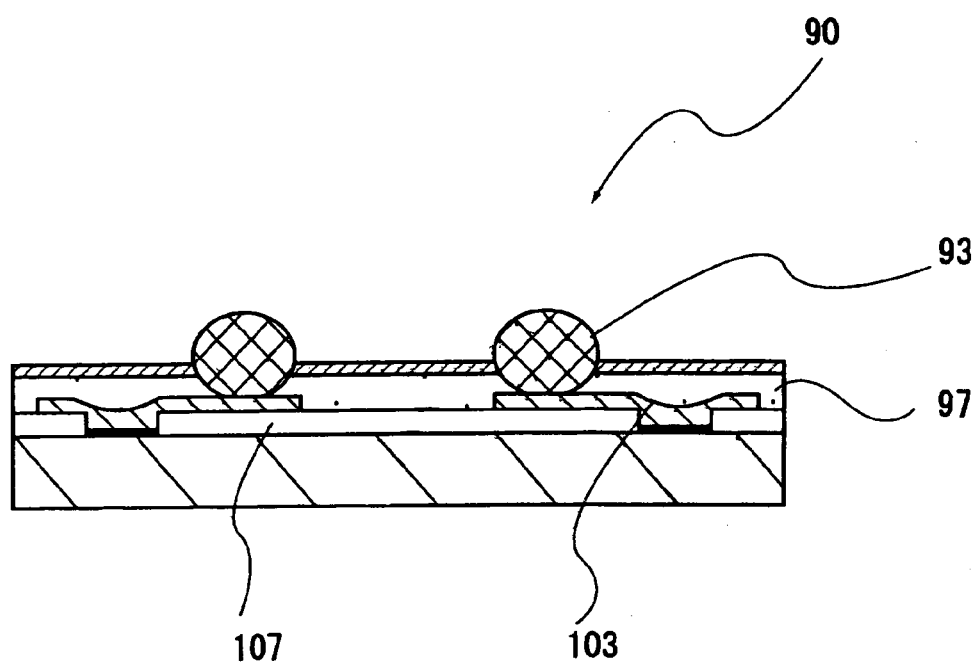
FIG. 15 is a cross-sectional view for explaining the structure of a WCSP.

The type of the BGA applied to the present invention is not limited. Preferably, the type of the BGA is, e.g., BGAs 60, 70, and 80 as shown in FIGS. 12 to 14 so as to easily respond to the fine pitch and the multi-pin structure of the wiring. Alternatively, it is a wafer level chip size package (WCSP) 90 as shown in FIG. 15.

Referring to FIG. 12, a BGA 60 is a semiconductor device with a bump comprising: a bear chip 61; an interposer 63 for mounting the bear chip 61 by a wiring bonding 68; and bumps (soldering balls) 65 which are arranged like an area array with the pitch of 0.6 mm to 2.54 mm on the back surface of the interposer 63.

FIG. 13 shows a BGA 70 which is obtained by a so-called flip chip method by which bumps 71 are previously formed on a bonding pad 75 of the bear chip 61, and are connected to inner leads (not shown) on the interposer 63 by thermal soldering reflow processing or ultrasonic vibration in a state in which pressure is applied.

FIG. 14 shows a BGA 80 which is obtained by a so-called TAB (Tape Automated Bonding) method by which bumps are previously formed to inner leads on a tape or the bear chip 61 and they are connected by the inner-lead bonding.

Referring to FIG. 15, a WCSP is a CSP comprising, at the wafer stage, a wiring 103, electric insulating films 97 and 107, and bumps (soldering balls) 93 which are arranged like an area array with the pitch of 0.1 mm to 1.0 mm, not via an interposer. In particular, upon desiring a thin, light, and compact mounting structure, the WCSP is a semiconductor device with the best bump.

(2) Bump

Figure 16A:
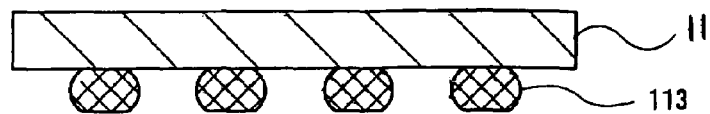
FIGS. 16(a) and (b) are a diagram for explaining a bump in a mounting structure of a semiconductor device with the bump according to a modification of the first embodiment.

The form of the bump provided for the BGA is not limited; however, referring to FIG. 16(a), preferably, the edge portion of a bump 113 is flat.

Because, when the BGA is positioned and mounted onto the pad of the circuit board, the bump uniformly flows around the pad and the bump of the BGA and the pad are strongly fixed.

Figure 16B:
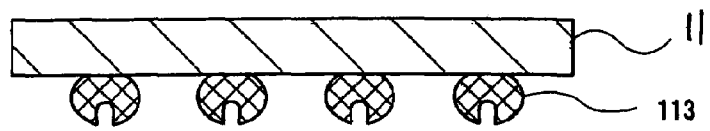

Preferably, referring to FIG. 16(b), as the bump arranged to the BGA, a cave (recessed) portion is provided onto the surface of the edge portion of the bump 113.

Because the above structure causes the existence of the soldering material via the cave portion between the bump of the BGA and the pad, these members are strongly fixed.

(3) Soldering Material

1) Type

The type of the soldering material adhered to the bump is not limited. For example, it is a commonly-used soldering material containing Sn or Pb/Sn, or flux material such as resin or common rosin. Preferably, the type of the soldering material is one obtained by combining a soldering containing Cu/Sn/Ag without Pb and the flux material.

SECOND EMBODIMENT

Figure 17:
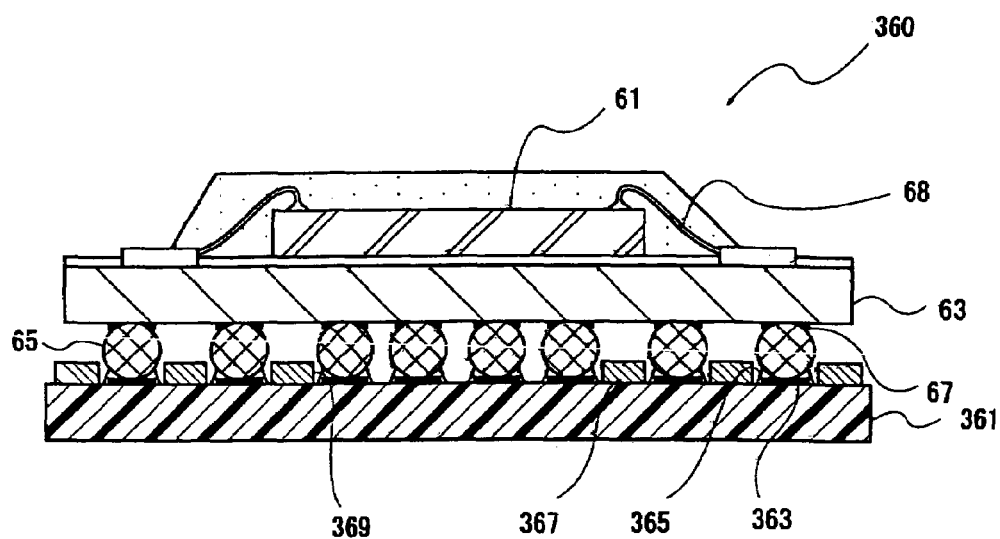
FIG. 17 is a diagram for explaining a mounting structure of a semiconductor device with a bump according to a second embodiment.

According to a second embodiment, referring to FIG. 17, a circuit board 361 comprises a pad 363 for mounting a BGA (interposer) 63, a wiring (not shown), and a soldering resist 367. Further, the soldering resist 367 has an opening portion 369 which is opened so that the entire or part of the pad 363 and wiring connected to the BGA 63 is exposed. In a mounting structure 360 of the BGA, the BGA 63 is mounted on the circuit board 361.

Hereinbelow, the same portions as those according to the first embodiment are omitted and features according to the second embodiment are mainly described.

1. Structure (1) Basic Structure

The mounting structure 360 of the BGA according to the second embodiment basically comprises: the BGA 63; the circuit board 361; and a soldering material 365. The BGA 63, the circuit board 361, and the soldering material 365 are the same as those according to the first embodiment and they are not described here.

(2) Under-Fill

Figure 18:
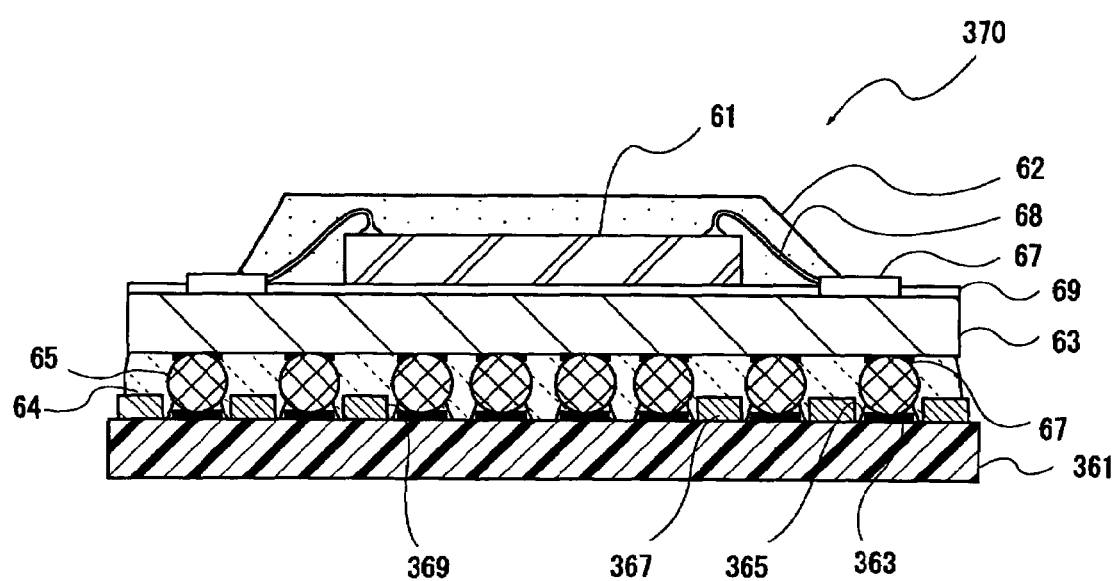
FIG. 18 is a diagram for explaining an under-fill.

According to the second embodiment, referring to FIG. 18, preferably, an under-fill 64 having the following properties is filled between a semiconductor device with a bump (BGA) and the circuit board 361.

1) volume resistance having a value within a range of $1 \times 10^6$ to $1 \times 10^{20}$ Ω·cm.
2) tensile strength having a value within a range of 1 to 200 MPa.
3) break stretch having a value within a range of 10% to 500%.

Hereinbelow, a detailed description is given of preferred types of the under-fill and the preferred property thereof.

1) Type

Preferably, the type of the under-fill is one containing thermosetting resin and photo-curing resin and, alternatively, it is one of them.

Because the use of the curing resin satisfies the basic properties as the under-fill including mechanical strength and moisture resistance.

Preferably, epoxy resin or silicon resin is used as the thermosetting resin; as the photo-curing resin, epoxy resin, acrylic resin, and silicon resin are used.

Preferably, when it is desired that the under-fill have a shading or shielding property, a shading material, e.g., carbon particles, carbon fiber, or pigment is added to the curing resin. Alternatively, an ultraviolet absorbing agent or fluorescent brightening agent is added.

As a result of adding these compounds, light entering from the outside is effectively absorbed or the wavelength thereof is converted into light having a wavelength which prevents optically erroneous operation.

2) Volume Resistance

Preferably, the volume resistance of the under-fill is within a range of $1 \times 10^6$ to $1 \times 10^2$ Ω·cm.

Because, when the volume resistance of the under-fill is less than $1 \times 10^6$ Ω·cm, the insulation between the adjacent bumps becomes insufficient. When the volume resistance of the under-fill is over $1 \times 10^{20}$ Ω·cm, the selection of available materials is remarkably limited.

Therefore, more preferably, the volume resistance of the under-fill is within a range of $1 \times 10^8$ to $1 \times 10^{18}$ Ω·cm. Even more preferably, it is within a range of $1 \times 10^{10}$ to $1 \times 10^{16}$ Ω·cm.

3) Tensile Strength

Preferably, the tensile strength of the under-fill is within a range of 1 to 200 MPa.

Because, when the tensile strength of the under-fill is less than 1 MPa, the mechanical strength is reduced and resistance stability and thermal tolerance are reduced in the mounting structure of the semiconductor device with the bump. When the tensile strength of the under-fill is over 200 MPa, the selection of available materials is extremely limited, the strain of stress is excessively caused, and the stability for resistance is deteriorated in the mounting structure of the semiconductor device with the bump.

Thus, more preferably, the tensile strength of the under-fill is within a range of 5 to 100 MPa. Even more preferably, it is within a range of 10 to 50 MPa.

4) Break Stretch

Preferably, the break stretch of the under-fill is within a range of 10% to 500%.

Because, when the break stretch of the under-fill is less than 10%, the flexibility is deteriorated and the stability for resistance and the thermal tolerance are deteriorated in the mounting structure of the semiconductor device with the bump. When the break stretch of the under-fill is over 500%, the selection of available materials is extremely limited, and the mechanical strength is reduced.

More preferably, the break stretch of the under-fill is within a range of 30% to 300%. Even more preferably, it is within a range of 50% to 200%.

2. Mounting Method (1) First Mounting Method

Figure 19A:
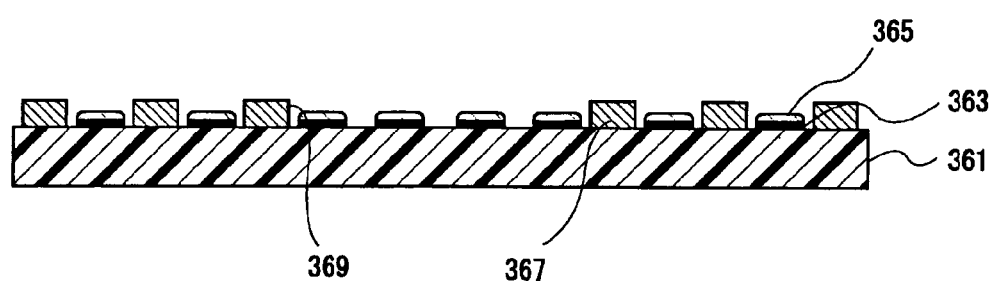
FIGS. 19(a) and (b) are a diagram showing processes for explaining one method for mounting the BGA on a circuit board (No. 1).
Figure 19B:
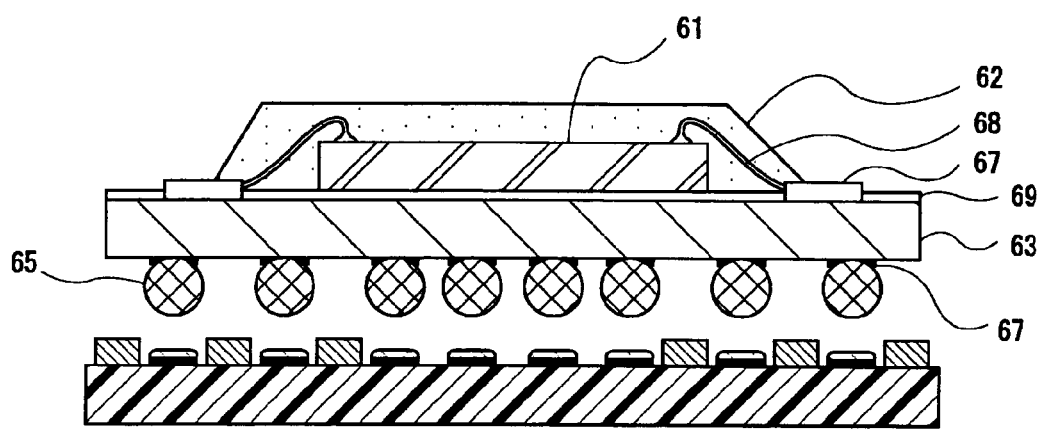

Preferably, referring to FIG. 19, the BGA 63 is mounted on the circuit board 361 having the soldering resist 367 in the following steps (A) and (B) according to the first mounting method.

(A) A step of coating the soldering material 365 on the pad 363 on the circuit board 361 having the soldering resist 367.

(B) A step of mounting the BGA 63 on the pad 363 which is coated with the soldering material 365 by reflow processing.

With the foregoing, the soldering material is coated by using a conventional coating device, e.g., a silkscreen printing device. Further, the BGA is mounted on the circuit board by using a conventional reflow device.

Preferably, after positioning the BGA to the pad on the circuit board, it is subjected to reflow processing. In this case, preferably, the BGA previously has a positioning mark as a mark and the BGA is positioned on the pad.

(2) Second Mounting Method

Figure 20A:
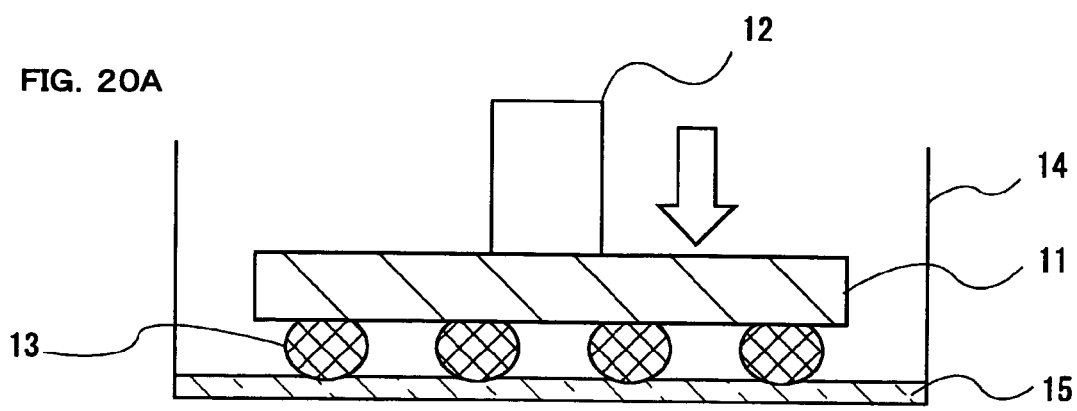
FIGS. 20(a) and (b) are a diagram showing processes for explaining another method for mounting the BGA on the circuit board (No. 2).
Figure 20B:
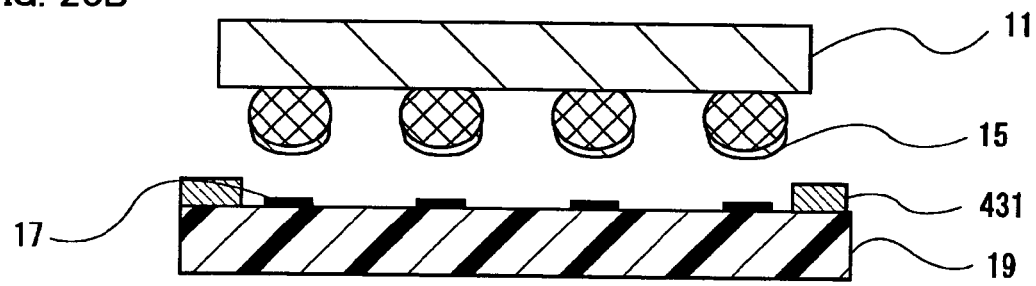

Preferably, referring to FIG. 20, a BGA 11 is mounted on a circuit board 19 having a soldering resist 431 in the following steps (A') and (B) according to the second mounting method.

(A') A step of coating a soldering material 15 on a bump 13 of the BGA 11.

(B) A step of mounting the BGA 11, which is coated with the soldering material 15, on the pad 17 by reflow processing.

The above operations cause the omission of a positioning step upon coating the soldering material on the pad, and the BGA is precisely mounted, by reflow processing, on the circuit board such as the FPC which is relatively easily modified. That is, the BGA or CSP is mounted on the circuit board, particularly, the FPC by reflow processing at high speed and with low costs. Further, a mounting method of the BGA is provided with suppressed defects for mounting.

(3) Third Mounting Method

Preferably, referring to FIG. 21, the BGA 11 is mounted on the circuit board 19 having the soldering resist 431 in the following steps (A"), (A'''), and (B') according to third mounting method.

(A") A step of coating one part 21 of the soldering material on the pad 17 on the circuit board 19.

(A''') A step of coating another part 15 of the soldering material on the bump 13 of the BGA 11.

(B') A step of mounting the BGA 11, which the soldering material 15 is partly coated, on the pad 17 to which the soldering material 21 is partly coated, by reflow processing.

With the foregoing operation, the BGA is precisely mounted on the circuit board, in particular, the FPC by reflow processing. Further, the mounting method for strongly mounting the BGA is provided.

(4) Reflow Processing Condition

Upon using the first to third mounting methods, the reflow processing condition is not limited; however, preferably, the heat processing is performed by using infrared or heated inert gas under conditions that the peak temperature range is 200° C. to 300° C. and the heating time is 5 sec to 10 min.

Preferably, during reflow processing, the reflow processing is performed in an inert state so as to prevent the oxidization of the soldering material.

(5) Simultaneous Mounting with Another Element

Preferably, referring to FIG. 4, according to the first to third mounting methods, the BGA 11 and another electronic element 39 such as a capacitor are simultaneously mounted on the circuit board 19 having the soldering resist 431.

Because the BGA and the other electronic element including the capacitor are simultaneously mounted, the number of steps of mounting using the ACF other than reflow processing is reduced. Therefore, the step of mounting the BGA is entirely simple and fast.

Conventionally, the electronic element such as the capacitor or a resistor, other than the BGA, is mounted by reflow processing. However, since the BGA is mounted by ACF, there is a problem that the BGA must be mounted by another mounting method.

THIRD EMBODIMENT

According to a third embodiment, an electro-optic device comprises a BGA, as a driving element or a power supply element, which is mounted on a circuit board comprising a pad for mounting the BGA, a wiring, and a soldering resist, wherein the circuit board includes an opening portion which is open so that the entire or a part of the pad and wiring connected to the BGA is exposed.

Hereinbelow, a description is given of a liquid crystal panel forming the electro-optic device shown in FIG. 22.

Figure 22:
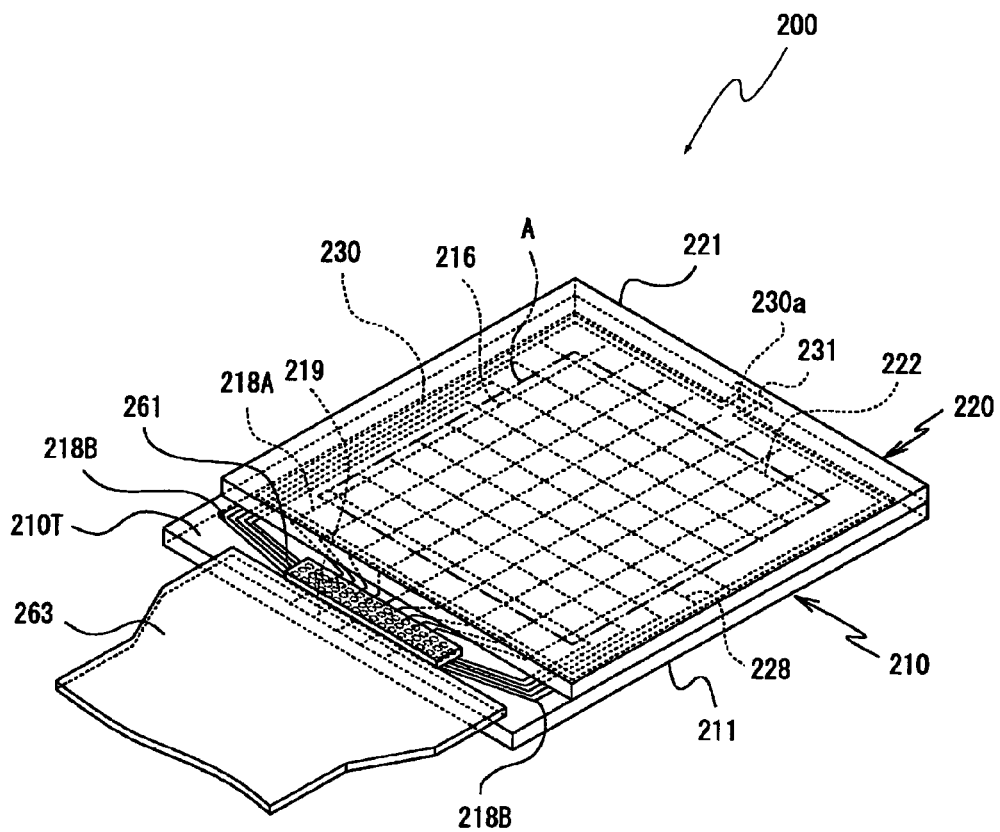
FIG. 22 is a perspective view schematically showing the appearance of a liquid crystal panel according to a third embodiment of the present invention.
Figure 23:
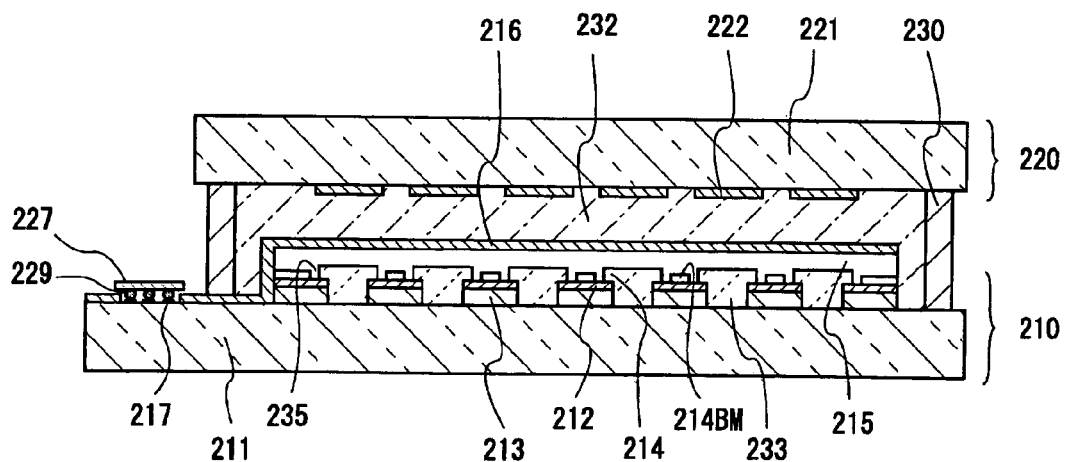
FIG. 23 is a cross-sectional view schematically showing the structure of a panel according to the third embodiment.

First, a description is given of the schematic structure of a liquid crystal panel 200 shown in FIG. 22 with reference to FIG. 23. FIG. 23 is a diagram schematically showing a state before mounting a semiconductor device (IC) and a flexible printed-circuit board (FPC) of the liquid crystal panel 200 shown in FIG. 22. The dimensions in FIG. 23 are appropriately adjusted for the sake of the convenience and select components in FIG. 23 are properly omitted.

The liquid crystal panel 200 comprises: a color filter substrate 210; an opposed substrate 220 of the color filter substrate 210, which is adhered thereto by a sealing material 230; and a liquid crystal material 232. The color filter substrate 210 comprises: a first substrate 211 having thereon reflecting layers 212 and a plurality of coloring layers 214; a surface protecting layer 215; and a transparent electrode 216 on the layer structure thereof. As mentioned above, the transparent electrode 216 is connected to a wiring 218A, the wiring 218A passes between the sealing member 230 and the first substrate 211, and it is pulled out onto a substrate extended portion 210T. The substrate extended portion 210T has thereon an input terminal portion 219.

Further, the substrate extended portion 210T comprises: a pad for mounting the BGA; a wiring for connecting the pad and an external terminal; and a soldering resist having an opening portion for exposing the pad and the wiring. Furthermore, the substrate extended portion 210T comprises: a BGA 227 as a driving element or a power supply element of the liquid crystal panel 200.

Consequently, the soldering material is precisely coated to the pad of the substrate extended portion 210T with the wide margin. In the case of mounting the BGA as a semiconductor device with the fine bump structure, the substrate exposed portion 210T is provided with the suppressed positional deviation of the BGA, which is caused by the coating defect of the soldering material.

Thus, the driving of the liquid crystal using the BGA is stable and the liquid crystal panel obtains excellent tolerance.

FOURTH EMBODIMENT

A detailed description is given of the case of using an electro-optic device as a display device of an electronic device according to an embodiment.

(1) Outline of Electronic Device

Figure 24:
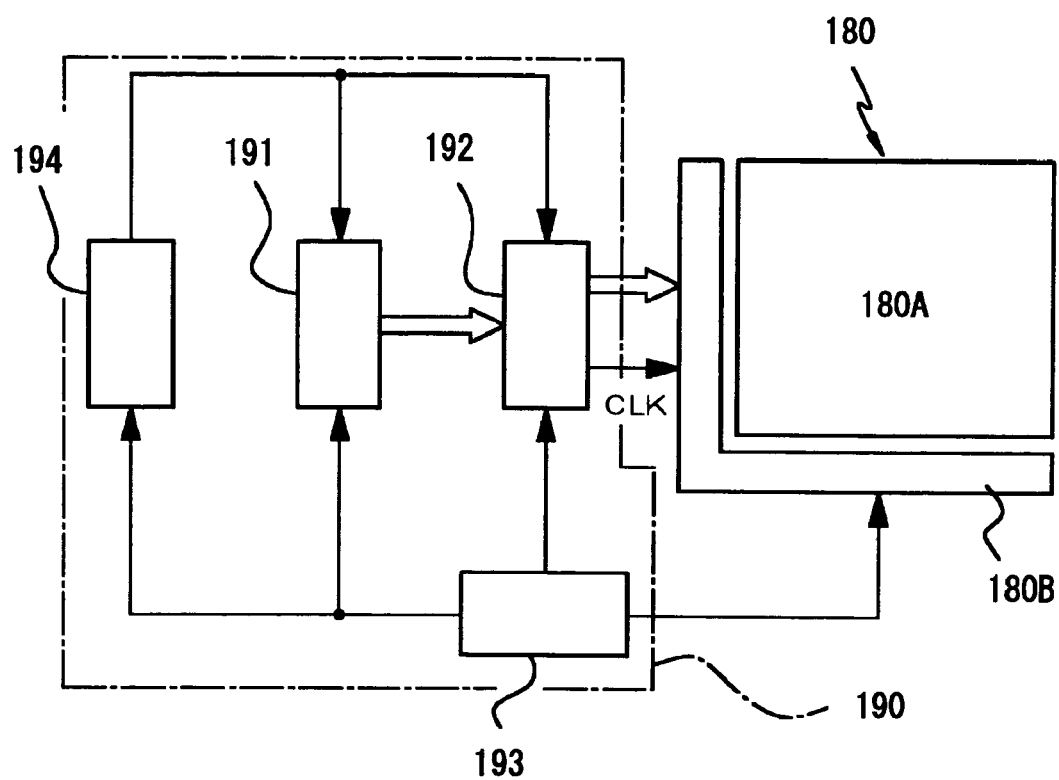
FIG. 24 is a block diagram schematically showing the structure of an electronic device according to a fourth embodiment.
Figure 25:
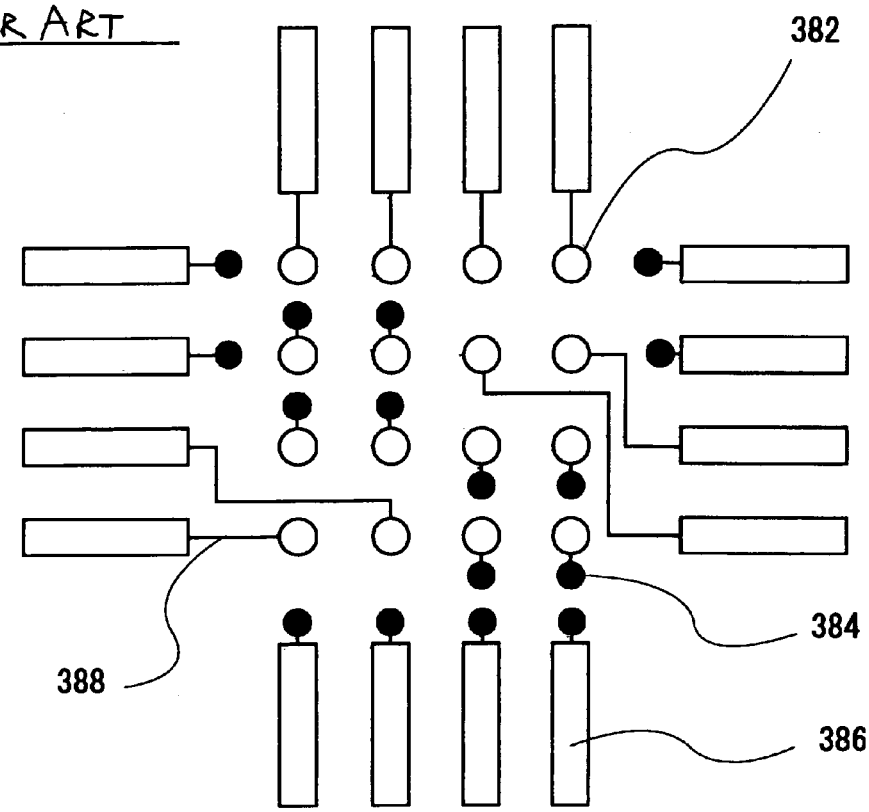
FIG. 25 is a diagram for explaining a conventional circuit board.
Figure 26:
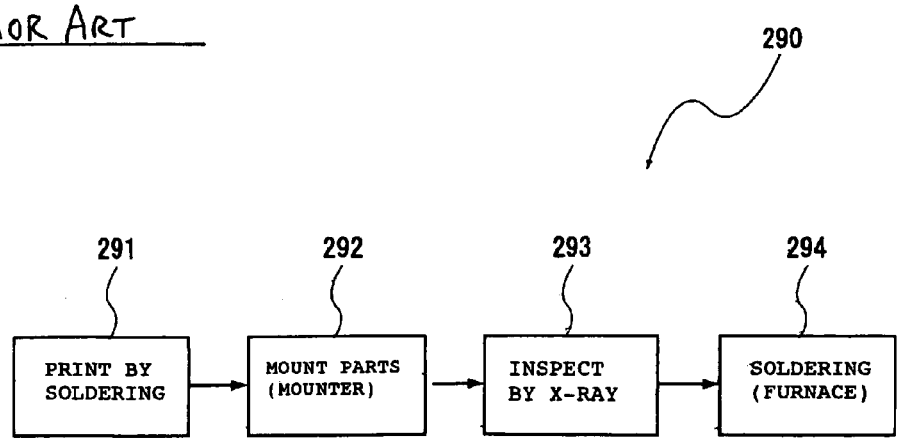
FIG. 26 is a flowchart for explaining a conventional mounting method of a BGA.
Figure 27A:
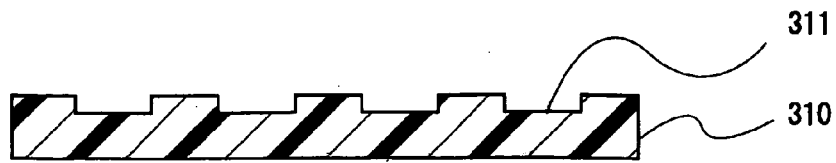
FIG. 27A-D is a diagram for explaining a mounting method of the BGA using a cave portion arranged on a conventional PCB.
Figure 27B:
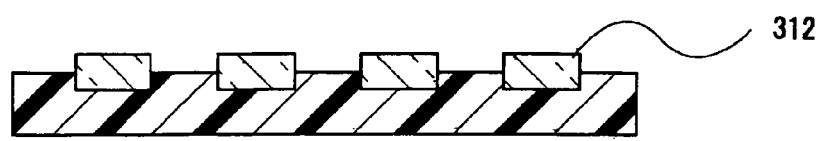
Figure 27C:
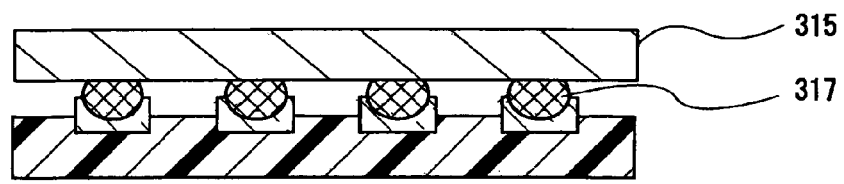
Figure 27D:
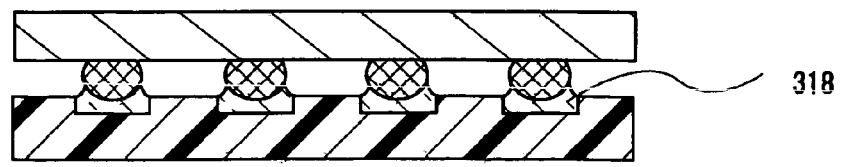
Figure 28A:
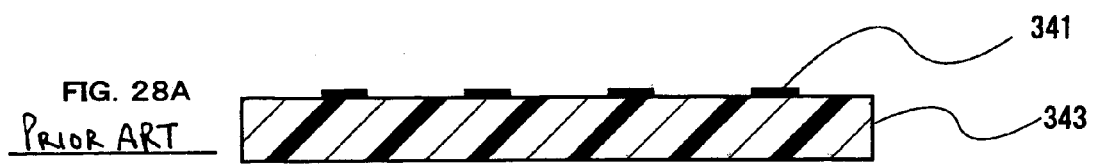
Figure 28B:
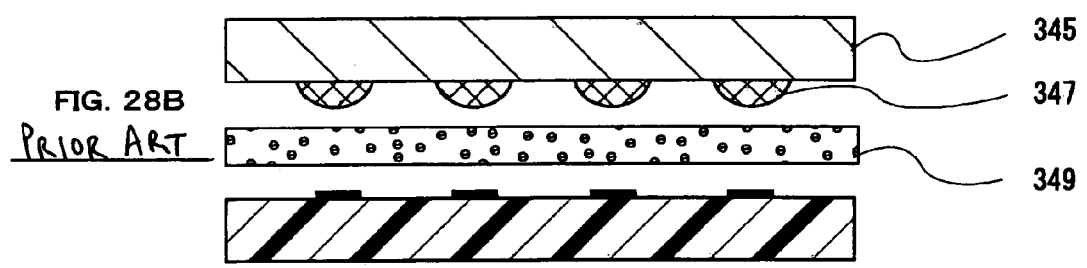
Figure 28C:
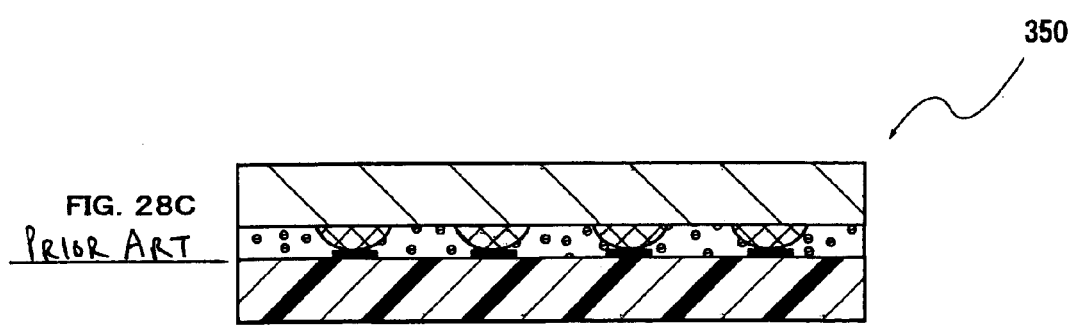

FIG. 24 is a diagram showing the entire structure of the electronic device according to the fourth embodiment. The electronic device comprises: a liquid crystal panel 180; and control means 190 for controlling the liquid crystal panel 180. Referring to FIG. 24, the liquid crystal panel 180 is conceptually divided into a panel structure 180A and a driving circuit 180B comprising a semiconductor IC.

Preferably, the control means 190 comprises: a display information output source 191; a display information processing circuit 192; a power supply circuit 193; and a timing generator 194.

Preferably, the display information output source 191 comprises: a memory having a ROM (Read Only Memory) or a RAM (Random Access Memory); a storage unit having a magnetic recording disk and an optical recording disk; and a tuning circuit for synchronously outputting a digital image signal. Further, the display information output source 191 supplies display information as a predetermined-format image signal to the display information processing circuit 192 based on various clock signals generated by the timing generator 194.

Preferably, the display information processing circuit 192 comprises well-known circuits of a serial/parallel converting circuit, an amplifying and inverting circuit, a rotation circuit, a gamma correcting circuit, and a clamping circuit, and executes processing of the input display information, thereby supplying the image information and a clock signal CLK to the driving circuit 180B. Preferably, the driving circuit 180B comprises: a scanning line driving circuit; a data line driving circuit; and an inspecting circuit. The power supply circuit 193 has a function for supplying predetermined voltages to the above components.

(2) Example

An electro-optic device according to the present invention includes, for example, a liquid crystal display device, an organic electro-luminescence device, an inorganic electro-luminescence device, a plasma display device, an FED (Field Emission Display) device, an LED (Light-Emitting Diode) display device, an electrophoretic migration, a thin cathode-ray tube, a liquid crystal shutter, a device using a digital micro-mirror device (DMD), and the like. These electro-optic devices can be applied to electronic devices, e.g., a personal computer, a cellular phone, a liquid crystal TV, a view-finder or direct-viewing monitor type video tape recorder (camcorder), a car navigation device, a pager, a PDA, a calculator, a word processor, a work station, a TV phone, a POS terminal, and an electronic device having a touch panel, among others.

Further, the electro-optic device and the electronic device are not limited to the examples as shown above, and may be variously modified within the spirit of the present invention. The liquid crystal panel according to the embodiments has a simple-matrix structure, and further is applicable to active-matrix electro-optic devices having an active element, such as a TFT (thin-film transistor) or a TFD (thin-film diode).

Advantages

As mentioned above, the circuit board of the present invention comprises the pad, the wiring, and the soldering resist having the opening portion for exposing the pad and the wiring. Consequently, it is possible to provide a circuit board in which the soldering material is precisely coated to the pad on the circuit board with the wide margin and the mounting position of the BGA is not deviated.

Further, the mounting structure of the BGA according to the present invention uses the circuit board having the opening portion for exposing the pad and the wiring. Consequently, it is possible to provide the mounting structure to prevent the deviation of the mounting position of the BGA.

Furthermore, the electro-optic device and the electronic device including it according to the present invention use the circuit board having the opening portion for exposing the pad and the wiring. Therefore, it is possible to provide the electro-optic device and the electronic device including it, in which the soldering defect is suppressed and the manufacturing efficiency is improved.

The entire disclosure of Japanese Patent Application No. 2002-298980 filed Oct. 11, 2002 is incorporated by reference.

What is claimed is:

1. A circuit board comprising:
   a ball grid array including a substrate and a soldering ball disposed on the substrate;
   a board;
   a pad for mounting the soldering ball of said ball grid array on said board;
   a wiring connected to said pad; and
   a soldering resist having an opening portion which exposes said pad and said wiring in a region on which said ball grid array is mounted on said board, the soldering resist being connected to said board and separated from said substrate of said ball grid array by at least a filler material, said soldering resist including a thickness being approximately one percent to 50% of a height of the soldering ball of said ball grid array mounted on said board.

2. A circuit board of claim 1, wherein when an area of said ball grid array which is mounted on said board is 100%, an area of said opening portion is within a range of 50% to 150%.

3. A circuit board of claim 1, wherein in the region in which said ball grid array is mounted on said board, an end portion of said soldering resist is at least 0.1 mm inboard of an outer circumference of the region.

4. A circuit board of claim 1, wherein when a pitch of a bump of said bait grid array mounted on said board includes a narrow pitch portion less than 0.6 mm and a wide pitch portion not less than 0.6 mm, said soldering resist has an opening portion corresponding to the narrow pitch portion of said ball grid array.

5. A circuit board of claim 1, wherein a thickness of said soldering resist is 1% to 50% of a height of a bump of said ball grid array mounted on said board.

6. A circuit board of claim 1, wherein said board has a second pad for mounting an electronic element other than said ball grid array on said board, said soldering resist adjacently exists around said second pad.

* * * * *